(12) United States Patent
Hasegawa et al.

(10) Patent No.: US 8,004,189 B2
(45) Date of Patent: Aug. 23, 2011

(54) ORGANIC LIGHT-EMITTING DEVICE AND DISPLAY APPARATUS USING THE SAME

(75) Inventors: Toshinori Hasegawa, Yokohama (JP); Nozomu Izumi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 609 days.

(21) Appl. No.: 12/034,702

(22) Filed: Feb. 21, 2008

(65) Prior Publication Data

US 2008/0203908 A1 Aug. 28, 2008

(30) Foreign Application Priority Data

Feb. 27, 2007 (JP) ................................ 2007-046690

(51) Int. Cl.
*H01J 1/62* (2006.01)
*H01J 63/04* (2006.01)

(52) U.S. Cl. .................... 313/512; 313/504; 313/506

(58) Field of Classification Search ............ 313/498–512
See application file for complete search history.

(56) References Cited

U.S. PATENT DOCUMENTS

| | | | | |
|---|---|---|---|---|
| 5,674,636 A | * | 10/1997 | Dodabalapur et al. | 428/690 |
| 5,780,174 A | * | 7/1998 | Tokito et al. | 428/690 |
| 5,814,416 A | * | 9/1998 | Dodabalapur et al. | 428/690 |
| 7,126,269 B2 | | 10/2006 | Yamada | 313/504 |
| 7,642,714 B2 | * | 1/2010 | Bechtel et al. | 313/509 |
| 2003/0085652 A1 | * | 5/2003 | Weaver | 313/506 |
| 2005/0236982 A1 | * | 10/2005 | Nakayama et al. | 313/506 |
| 2006/0125389 A1 | * | 6/2006 | Song et al. | 313/506 |
| 2007/0252520 A1 | | 11/2007 | Hasegawa | 313/504 |

FOREIGN PATENT DOCUMENTS

| | | |
|---|---|---|
| JP | 2001-357973 | 12/2001 |
| JP | 2003-109775 | 4/2003 |

OTHER PUBLICATIONS

English language translation of JP 2001-357973.*

* cited by examiner

*Primary Examiner* — Nimeshkumar Patel
*Assistant Examiner* — Thomas A Hollweg
(74) *Attorney, Agent, or Firm* — Fitzpatrick, Cella, Harper & Scinto

(57) ABSTRACT

Provided is a thin organic light-emitting device which exhibits satisfactory emission characteristics and is hardly affected by film thickness fluctuation in individual layers and exhibits stable emission characteristics and which includes a substrate, a first electrode provided on the substrate, an organic compound layer provided on the first electrode, a second electrode provided on the organic compound layer, and a first sealing layer provided on the light extraction side of the second electrode, in which an optical distance between a first reflective surface located on the substrate side and a second reflective surface located on the sealing layer side is adjusted so as to form a resonance portion of a resonator structure for resonating light emitted from the organic compound layer, and in which the second reflective layer is an interface on the light extraction side of the first sealing layer.

8 Claims, 7 Drawing Sheets

ORGANIC LIGHT-EMITTING DEVICE AND DISPLAY APPARATUS USING THE SAME

BACKGROUND OF THE INVENTION

1. Field of the Invention

The present invention relates to a light-emitting device using an organic compound and a display apparatus using the device, and more specifically, to an organic light-emitting device (hereinafter, also simply referred to as device) that emits light when an electric field is applied to a thin film made of an organic compound, and a display apparatus using the device.

2. Description of the Related Art

Research and developmental works are now carried out actively on organic light-emitting devices (organic EL devices or organic electroluminescent devices). In such organic EL devices, typically, moisture or oxygen in an external environment causes deterioration of an organic compound, deterioration and peeling of an electrode/organic-substance interface, oxidization of electrodes, and the like. This results in a reduction of emission luminance, an increase of a driving voltage, generation and growth of a non-emission portion called a dark spot, and the like. As a result, there has been a problem concerning the reliability of the display apparatus.

In order to solve this problem, Japanese Patent Application Laid-Open No. 2001-357973 discloses a display apparatus in which a sealing layer constructed by stacking a plurality of inorganic material films having different moisture absorption characteristics is bonded to a light extraction side of a top emission type device.

FIG. 9 illustrates an example of the display apparatus disclosed in Japanese Patent Application Laid-Open No. 2001-357973. FIG. 9 illustrates a substrate 1, an organic light-emitting device 2, a silicon nitride film 3, a silicon oxide film 4, a silicon nitride film 5, a resin 6 that bonds a sealing layer and a glass substrate together, and a glass substrate 7. The sealing layer is constituted by three layers of the silicon nitride film 3, the silicon oxide film 4, and the silicon nitride film 5.

As for the film thickness of the sealing layer disclosed in Japanese Patent Application Laid-Open No. 2001-357973, the silicon nitride film 3 has a thickness of 2 to 3 μm, while the silicon oxide film 4 and the silicon nitride film 5, respectively, have a thickness of about 1 μm. Thus, the total thickness of the sealing layer is approximately 4 to 5 μm. Further, for the glass substrate 7, since processing into a cap shape is unnecessary, a comparatively thin glass substrate may be selected. Thus, a combination of a sealing layer obtained by stacking a plurality of layers of inorganic materials and a thin plate glass substrate may be used so that a thinner display apparatus can be realized in comparison with an apparatus obtained by a conventional technique using a sealing cover.

For the above described structure where a sealing layer is formed on the light extraction side of a top emission type device so that moisture or oxygen is prevented from entering, an organic light-emitting device is disclosed, which has a microcavity (or micro-resonator) structure for the purpose of improving the light extraction efficiency or achieving the emission of light having a desired chromaticity.

In an organic light-emitting device disclosed in Japanese Patent Application Laid-Open No. 2003-109775, a light extraction electrode (a second electrode) is constituted of a translucent reflective layer and a transparent conductive layer. In the organic light-emitting device, on the above-mentioned electrode, a passivation film having a refractive index comparable to that of the material constituting the electrode is formed in a thickness of 500 to 10,000 nm so that the device surface is protected. In this organic light-emitting device, the translucent reflective layer constituting a part of the light extraction electrode is formed of a thin film of silver or an alloy containing silver as a main component. In this device, a microcavity structure is formed between a reflective first electrode formed on a substrate side and the translucent reflective layer constituting a part of the light extraction electrode, and an organic compound layer interposed between the first electrode and the translucent reflective layer serves as a resonance portion.

In this organic light-emitting device, the optical distance between the first electrode and the translucent reflective layer, that is, the optical film thickness of the resonance portion is represented by L, and the phase shift generated when a light emitted from an emission layer is reflected by the first electrode and the translucent reflective layer is represented by $\phi$ (radian). Further, when the resonance wavelength of the microcavity structure is represented by $\lambda$. Then, the following Equation 1 is satisfied.

$$\lambda = 1/2Lx(m-\phi/2\pi) \; (m \text{ is an integer}) \quad \text{(Equation 1)}$$

It can be seen from Equation 1 that the resonance wavelength $\lambda$ varies depending on the optical film thickness L of the resonance portion, and hence the resonance effect of the microcavity structure can be adjusted. Incidentally, the optical film thickness L is a total (n1d1+n2d2+ . . . ) of the optical film thicknesses (i.e., refractive index (n) ×film thickness (d)) of the respective organic compound layers interposed between the first electrode and the translucent reflective layer.

In an organic light-emitting device having such a microcavity structure, a light exiting to the outside of the device receives the effect by the resonator as expressed by Equation 1, so that the emission characteristics thereof such as emission luminance and chromaticity are changed. That is, by adjusting the resonance effect, the emission characteristics of the device can be controlled.

FIG. 10 is a schematic cross-sectional view of an organic light-emitting device having a microcavity structure. FIG. 10 illustrates a substrate 1, a reflective electrode 8 serving as an anode, a transparent conductive layer 9, a hole-transporting layer 10, an emission layer 11, an electron-transporting layer 12, and an electron injection layer 13. Further, FIG. 10 illustrates a translucent reflective layer 14 made of silver, a transparent electrode 15 made of IZO, a silicon nitride film (sealing layer) 4, and light E emitted from the organic light-emitting device. Here, the silicon nitride film 4 formed on the transparent electrode 15 corresponds to the passivation film in Japanese Patent Application Laid-Open No. 2003-109775. In this organic light-emitting device, a microcavity structure is formed between the reflective electrode 8 and the translucent reflective layer 14, and the light E passes through the sealing layer 4 from the transparent electrode 15 side to the outside.

Here, using a general-purpose calculation software, a simulation analysis was carried out for the emission colors of an organic light-emitting device having the sealing layer disclosed in Japanese Patent Application Laid-Open No. 2003-109775 and shown in FIG. 10 and an organic light-emitting device having neither a sealing layer nor a translucent reflective layer as shown in FIG. 11. FIG. 10 is a schematic cross-sectional view of the organic light-emitting device disclosed in Japanese Patent Application Laid-Open No. 2003-109775. FIG. 11 is a schematic cross-sectional view of an organic light-emitting device having none of a sealing layer and a translucent reflective layer.

The film thicknesses of the hole-transporting layer and the electron injection layer of each of such organic light-emitting devices that have a microcavity structure and emit blue light were variously changed, and the emission characteristics were estimated by the simulation analysis. Tables 1 and 2 show the film thicknesses of the layers and the chromaticity changes of the emission color of the analyzed organic light-emitting devices.

TABLE 1

Film thickness configuration

|  | FIG. 10 | FIG. 11 |
|---|---|---|
| Silicon nitride layer | 2,000 nm | — |
| Transparent conductive film |  | 60 nm |
| Translucent reflective layer | 20 nm | — |
| Electron injection layer | 10-100 nm, 5 nm step |  |
| Electron-transporting layer | 10 nm |  |
| Emission layer | 20 nm |  |
| Hole-transporting layer | 10-70 nm, 5 nm step |  |
| Transparent conductive layer | 10 nm |  |
| Reflective electrode | 100 nm |  |
| Substrate | 635,000 nm |  |

TABLE 2

Emission chromaticity change by film thickness adjustment

|  | Chromaticity adjustment range | FIG. 10 | FIG. 11 |
|---|---|---|---|
| CIEx | Lower limit | 0.121 | 0.131 |
|  | Upper limit | 0.402 | 0.327 |
|  | Adjustment range | 0.281 | 0.197 |
| CIEy | Lower limit | 0.066 | 0.077 |
|  | Upper limit | 0.526 | 0.534 |
|  | Adjustment range | 0.460 | 0.458 |

It can be seen from Table 2 that in the organic light-emitting device having a microcavity structure, when the resonance effect is adjusted by means of the film thickness, light emission of approximately 0.066 in terms of the chromaticity coordinate CIEy value can be achieved. That is, a blue color which is deeper than that in the case of the organic light-emitting device shown in FIG. 11 can be reproduced.

As described above, in the organic light-emitting device having a microcavity structure shown in Japanese Patent Application Laid-Open No. 2003-109775, even when a member that exerts an optical influence, such as a sealing layer, is formed, the emission color can be adjusted. Further, the degree of freedom in the adjustment is higher than that of a conventional organic light-emitting device having no sealing layer.

Such adjustment of the emission characteristics is achieved by the strong resonance effect of the microcavity structure. Incidentally, also in the organic light-emitting device with the structure shown in FIG. 11, the refractive index difference between the transparent electrode 15 and the external environment (dry air) causes a part of emission light to be reflected by the interface. The light reflected by the interface resonates between the interface and the reflective electrode on the substrate side. That is, the organic light-emitting device shown in FIG. 11 also has a microcavity structure.

Nevertheless, a difference is present in the resonance effect between the organic light-emitting device shown in FIG. 11 and the device disclosed in Japanese Patent Application Laid-Open No. 2003-109775 and shown in FIG. 10. This results from a difference in the reflectance of the light extraction side reflective portion.

FIG. 12 shows the results of an estimation using a general-purpose calculation software carried out for the reflectance at the interface between the transparent electrode 15 (IZO) of the organic light-emitting device of FIG. 11 and air, and the reflectance at the interface of the electron injection layer 13—translucent reflective layer 14 (20 nm)—transparent electrode 15 of the organic light-emitting device of FIG. 10.

As can be seen from FIG. 12, the reflectance of the device described in Japanese Patent Application Laid-Open No. 2003-109775 in which the translucent reflective layer is used, is higher than the reflectance at the interface between the transparent electrode 15 and the air. This causes a difference in the resonance effect between these microcavity structures.

In the organic light-emitting device of Japanese Patent Application Laid-Open No. 2003-109775, the reflectance of the translucent reflective layer on the light extraction side is sufficiently high. Therefore, even when the sealing layer is provided, the emission characteristics can be adjusted by using the strong resonance effect. Thereby, an organic light-emitting device can be realized that has a smaller thickness and whose emission characteristics can be controlled arbitrarily.

Nevertheless, in the organic light-emitting device having a microcavity structure disclosed in Japanese Patent Application Laid-Open No. 2003-109775 above, the resonance effect is determined by the film thickness and the refractive index of the organic compound layer. Therefore, a change in these parameters affects the emission characteristics of the device. Accordingly, if there is nonuniformity in a film thickness within a substrate surface where the organic light-emitting device is formed, or if there is a variation in film thickness between a plurality of organic light-emitting devices, the emission characteristics varies depending on the film thickness difference, which has posed a problem that it is difficult to produce devices having the same emission characteristics repeatedly with satisfactory reproducibility.

Tables 3 and 4 below show a change in the emission chromaticity in a case where the film thicknesses of the respective layers including the organic compound layer and the sealing layer that constitute the ordinary organic light-emitting device shown in FIG. 11 and the organic light-emitting device having the microcavity structure shown in FIG. 10 are changed uniformly within the range from −10% to +10%. The film thicknesses of the organic light-emitting devices at this time are as shown in Table 1. Incidentally, the term "change range" employed in the tables refers to a difference between an upper limit value and a lower limit value of each chromaticity coordinate.

TABLE 3

(Organic light-emitting device)
Change in emission chromaticity due to film thickness change

|  | −10% | −5% | 0% | +5% | +10% | Change range |
|---|---|---|---|---|---|---|
| CIEx | 0.153 | 0.149 | 0.144 | 0.137 | 0.133 | 0.020 |
| CIEy | 0.086 | 0.089 | 0.106 | 0.142 | 0.197 | 0.111 |

TABLE 4

(Microcavity type device)
Change in emission chromaticity due to film thickness change

|  | −10% | −5% | 0% | +5% | +10% | Change range |
|---|---|---|---|---|---|---|
| CIEx | 0.145 | 0.139 | 0.131 | 0.120 | 0.111 | 0.033 |
| CIEy | 0.086 | 0.104 | 0.134 | 0.184 | 0.262 | 0.175 |

As can be seen from Tables 3 and 4 above, the emission chromaticity of the device (microcavity type device) having a microcavity structure varies more greatly than the organic light-emitting device to which similar film thickness changes are imparted. That is, the emission characteristics of the device having a microcavity structure are sensitive to a film thickness change of each layer. Therefore, for the purpose of stabilization of the emission characteristics, there are required a film formation process having the controllability of film thickness improved in comparison with an ordinary process and a control system and a process step having higher precision for the film thickness. These requirements have caused the problem of a low throughput of the device production in the case of mass production of the microcavity type device.

SUMMARY OF THE INVENTION

The present invention has been accomplished in view of the above-mentioned problems. The present invention provides a thin organic light-emitting device that exhibits satisfactory emission characteristics and that is hardly affected by possible film thickness fluctuation in respective layers constituting the device and hence exhibits stable emission characteristics. Further, the present invention provides a display apparatus using a plurality of the organic light-emitting devices.

In order to solve the above-mentioned problem an organic light-emitting device according to the present invention includes a substrate; a first electrode provided on the substrate; an organic compound layer provided on the first electrode; a second electrode as a light extraction side electrode provided on the organic compound layer; and a first sealing layer provided on the light extraction side of the second electrode, in which an optical distance between a first reflective surface located on the substrate side relative to the organic compound layer and a second reflective surface located on the sealing layer side relative to the organic compound layer is adjusted so as to form a resonance portion of a resonator structure that causes resonance of light emitted from the organic compound layer, and in which the second reflective layer is an interface on the light extraction side of the first sealing layer.

According to the present invention, a reflective surface to be formed on a light extraction side of a microcavity structure is formed by utilizing a refractive index difference at an interface between a first sealing layer and a second sealing layer. Therefore, the reflection effect is small in comparison with a reflective surface formed by using a conventional metal material. This alleviates the resonance effect of the microcavity structure in comparison with the conventional light-emitting device. Accordingly, the fluctuation of the emission characteristics that results from the film thickness distribution and the film thickness variation in the organic light-emitting device or the sealing layer can be suppressed.

Further, according to the present invention, since the first sealing layer has a film thickness of 1,000 nm or less, adjustment of the emission characteristics utilizing the resonance effect can be performed effectively.

As a result, an organic light-emitting device can be realized in which a high production throughput is expected in a general-purpose process and which has a reduced thickness and high reliability. Further, a display apparatus using a plurality of such organic light-emitting devices can be realized.

Further features of the present invention will become apparent from the following description of exemplary embodiments with reference to the attached drawings.

DESCRIPTION OF THE EMBODIMENTS

Preferred embodiments of the present invention will now be described in detail with reference to the accompanying drawings.

Figure 1:
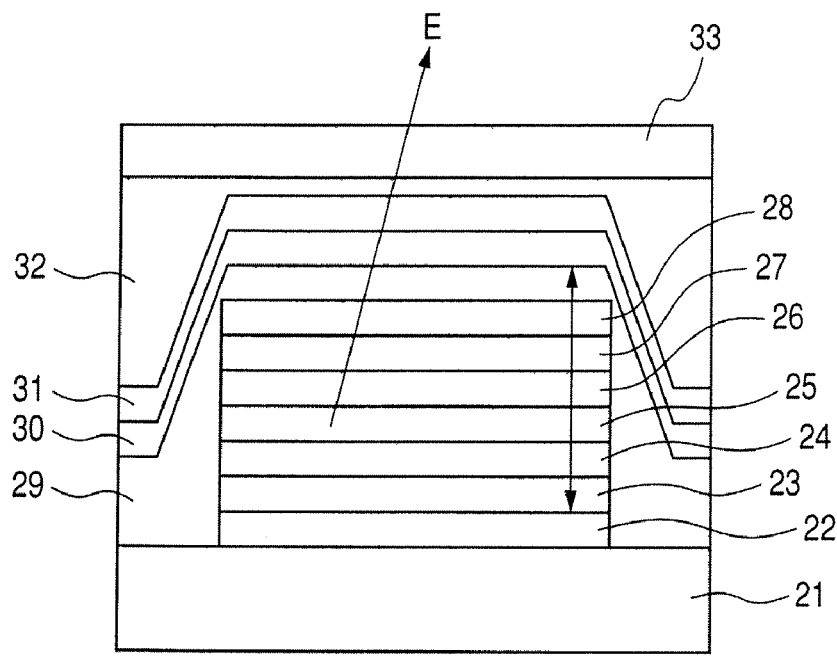
FIG. 1 is a schematic cross-sectional view illustrating an embodiment of an organic light-emitting device according to the present invention.

FIG. 1 illustrates an example of an organic light-emitting device according to the present invention. FIG. 1 is a schematic cross-sectional view of a top emission type organic light-emitting device. FIG. 1 illustrates a substrate 21, a reflective electrode (a first electrode) 22, a transparent conductive layer 23, a hole-transporting layer 24, an emission layer 25, an electron-transporting layer 26, and an electron injection layer 27. Further, FIG. 1 illustrates a transparent electrode (a second electrode) 28, a first sealing layer 29, a second sealing layer 30, a third sealing layer 31, a resin layer 32, and a glass substrate 33.

The substrate 21 used in the present invention is not limited to particular one, and may be of metal, ceramic, glass, quartz, or the like. Further, a flexible sheet such as a plastic sheet may be used so that a flexible display apparatus may be constructed.

As an anode on the substrate 21, the reflective electrode 22 and the transparent conductive layer 23 are formed. Preferably, the reflective electrode 22 has a reflectance of 50% or more, more preferably 80% or more, at the interface with the transparent conductive layer 23. The interface between the reflective electrode 22 and the transparent conductive layer 23 formed thereon serves as a first reflective surface that forms a microcavity structure in the present organic light-emitting device and that is located on the substrate side relative to the organic compound layer.

Examples of a material to be used as the reflective electrode 22 include, but not particularly limited to, metals such as silver, aluminum, chromium, and alloys thereof. An oxide conductive film, specifically, a compound film (ITO) composed of indium oxide and tin oxide, a compound film (IZO) composed of indium oxide and zinc oxide, or the like can be used as the transparent conductive layer 23.

Incidentally, the term "transparent" as employed herein means that the film has a transmittance of 70 to 100% with respect to visible light. To be more specific, the film desirably has an extinction coefficient κ of 0.05 or less, preferably 0.01 or less from the viewpoint of suppressing the extinction of emission light in the transparent conductive layer.

The thickness of the transparent conductive layer 23 in the present invention, although depending on the refractive index and the emission color, is preferably selected so as to fall within the range from 10 to 200 nm, more preferably from 10 to 150 nm. This is because when the film thickness of the hole-transporting layer 24 is set to be comparatively thin, the driving voltage can be reduced and an advantage is obtained from the viewpoint of power consumption.

Further, in a case where the work function of the reflective electrode 22 is comparatively high and hence the carrier injection barrier to the hole-transporting layer 24 is low, or alternatively in a case where a hole injection layer or the like is formed between the reflective electrode 22 and the hole-transporting layer 24, the transparent conductive layer 23 need not be formed in particular.

Each of organic compounds for use in the hole-transporting layer 24, the emission layer 25, the electron-transporting layer 26, and the electron injection layer 27, which form an organic compound layer, may be constituted by using a low-molecular weight material, by using a polymer material, or by using both the low-molecular weight material and the polymer material, and is not particularly limited. The hitherto known materials can be used as needed.

In addition, as the electron injection material, an electron injection property can be imparted to a organic compound material having electron transportability by incorporating 0.1 to several tens of percent of an alkali metal or alkali earth metal, or a compound thereof. Although the electron injection layer 27 is not an indispensable layer, the electron injection layer 27, which has a thickness of about 10 to 100 nm, is preferably inserted for securing good electron injection property in consideration of damage to be received at the time of subsequent formation of the transparent electrode 28.

For the organic compound layer of the present invention, a thin film is generally formed by a vacuum evaporation method, an ionization-assisted evaporation method, sputtering, plasma CVD, or a known coating method (such as spin coating, dipping, casting, or inkjet method) using a solution of a compound dissolved in an appropriate solvent.

The transparent electrode 28 has both functions as a cathode and an emission light extraction electrode. As the transparent electrode 28, an oxide conductive film similar to the transparent conductive layer 23 may be used. In the present invention, the second electrode is formed of a transparent electrode (an oxide transparent conductive film), where a translucent reflective layer for enhancing the effect of interference enhancement in the resonator is not used. The film thickness of the transparent electrode 28 is not limited to a particular value. However, when the thickness is set so as to fall within the range from 10 to 1,000 nm, preferably 30 to 300 nm, a desirable result is obtained from the viewpoint of the sheet resistance and the optical transmittance of the electrode. Further, film formation for the transparent electrode 28 may be performed by an arbitrary method. For example, sputtering may be used.

The first sealing layer 29, the second sealing layer 30, and the third sealing layer 31 are formed in order to protect the organic light-emitting device from oxygen, moisture, and the like in the external environment. When brought into contact with oxygen or moisture in the external environment, each organic compound material constituting the organic light-emitting device deteriorates and no longer exhibits desired characteristics. Thus, preferably, the sealing layers 29, 30, and 31 are formed of a material having a high blocking effect against oxygen and moisture.

Materials used as the sealing layers 29, 30, and 31 of the organic light-emitting device according to the present invention include: metal nitride films such as silicon nitride and silicon oxynitride; metal oxide films such as the tantalum oxide; a diamond thin film; and polymer films such as of silicon resin and polystyrene resin. Further, a photocurable resin and the like may be used.

In this embodiment, description will be made by taking, as an example, a case of a three-layer configuration in which the second sealing layer 30 is formed in contact with the light extraction side of the first sealing layer 29, while the third sealing layer 31 is formed in contact with the light extraction side of the second sealing layer 30. However, it is sufficient that the organic light-emitting device according to the present invention has at least one sealing layer (first sealing layer 29) which is in contact with the transparent electrode 28 serving as the light extraction side electrode. However, when the second sealing layer 30, and further the third sealing layer 31, are formed, higher sealing performance can be obtained. Further, no upper limit is present in the number of staked sealing layers. Therefore, a multilayer configuration including more than three layers may be used.

In the organic light-emitting device according to the present invention, the materials of the individual sealing layers are selected so that the refractive index difference at the interface between the first sealing layer 29 and the second sealing layer 30 is greater than the refractive index difference at the interface between the transparent electrode 28 and the first sealing layer 29. Therefore, preferably, the first sealing layer 29 includes a material having a comparatively high refractive index. Among such materials, a silicon nitride film has a high blocking effect against moisture and oxygen as well as a high refractive index, and hence is particularly suitable as the material of the first sealing layer 29.

The second sealing layer 30 includes a material having a lower refractive index than the first sealing layer 29. For example, when the first sealing layer 29 is a silicon nitride film, the second sealing layer 30 may be a silicon oxide film or a silicon oxynitride film. By virtue of this, the refractive index of the first sealing layer 29 can be made greater than the refractive index of the second sealing layer 30.

Table 5 collectively shows the refractive index and the extinction coefficient in various wavelengths of IZO, silicon nitride (SiN), and silicon oxide ($SiO_2$) which are used generally and widely as the transparent electrode 28.

TABLE 5

Refractive index and extinction coefficient of transparent electrode-sealing layer materials

|  |  | 350 nm | 400 nm | 450 nm | 500 nm | 550 nm | 600 nm | 650 nm | 700 nm |
|---|---|---|---|---|---|---|---|---|---|
| IZO | n | 2.50 | 2.23 | 2.11 | 2.05 | 2.01 | 1.98 | 1.97 | 1.95 |
|  | k | 0.15 | 0.06 | 0.03 | 0.02 | 0.02 | 0.01 | 0.01 | 0.01 |
| SiN | n | 1.98 | 1.95 | 1.92 | 1.91 | 1.90 | 1.89 | 1.88 | 1.87 |
|  | k | 0.01 | 0.00 | 0.00 | 0.00 | 0.00 | 0.00 | 0.00 | 0.00 |
| $SiO_2$ | n | 1.48 | 1.48 | 1.48 | 1.47 | 1.47 | 1.47 | 1.47 | 1.47 |
|  | k | 0.00 | 0.00 | 0.00 | 0.00 | 0.00 | 0.00 | 0.00 | 0.00 |

As can be seen from Table 5, when silicon nitride is selected as the first sealing layer 29 and silicon oxide is selected as the second sealing layer 30, the refractive index difference at the interface between the first sealing layer 29 and the second sealing layer 30 becomes greater than the refractive index difference at the interface between the transparent electrode 28 and the first sealing layer 29.

Here, the reflectance in each interface was estimated using a general-purpose calculation software. The results are illustrated in FIG. 2.

Figure 2:
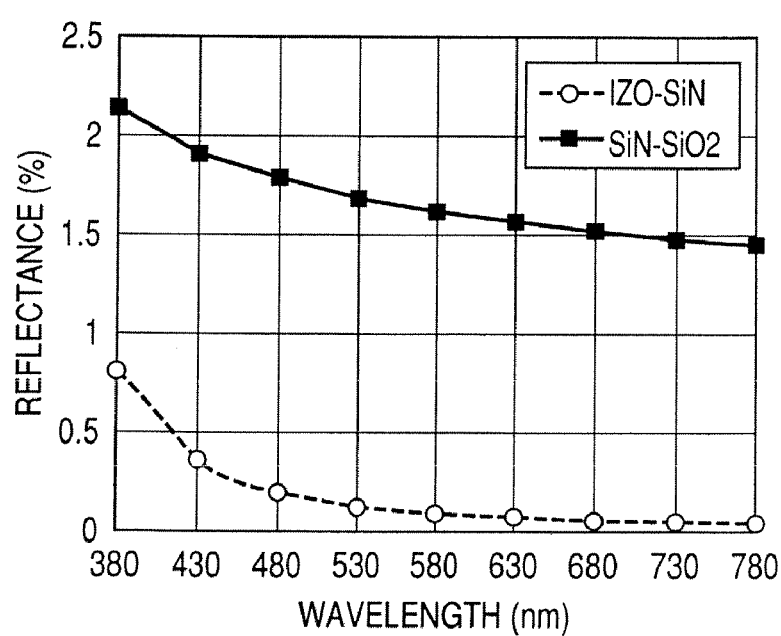
FIG. 2 is a graphical representation illustrating the reflectance at an interface between a transparent electrode and a first sealing layer and the reflectance at an interface between the first sealing layer and a second sealing layer.

As seen from FIG. 2, the reflectance at the interface between the first sealing layer 29 and the second sealing layer 30 where the greater refractive index difference is obtained is greater than the reflectance at the interface between the transparent electrode 28 and the first sealing layer 29. At that time, the interface between the first sealing layer 29 and the second sealing layer 30 serves as the second reflective surface located on the sealing layer side relative to the organic compound layer. Therefore, between this reflective surface and the first reflective surface on the substrate 21 side, a resonance portion of a microcavity structure that resonates light emitted from the organic compound layer is formed.

Figure 10:
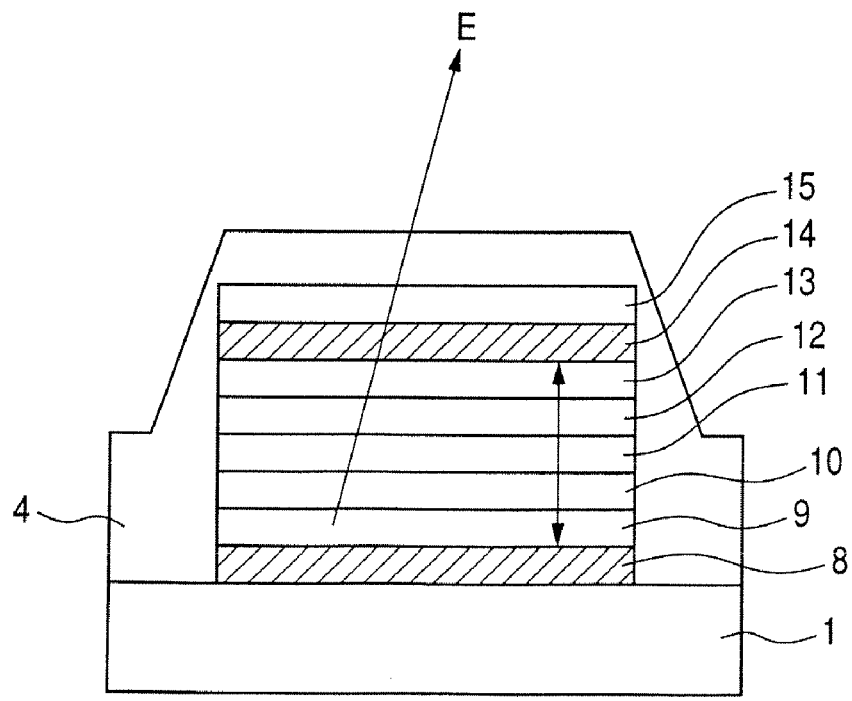
FIG. 10 is a schematic cross-sectional view illustrating a display apparatus described in Japanese Patent Application Laid-Open No. 2003-109775.
Figure 11:
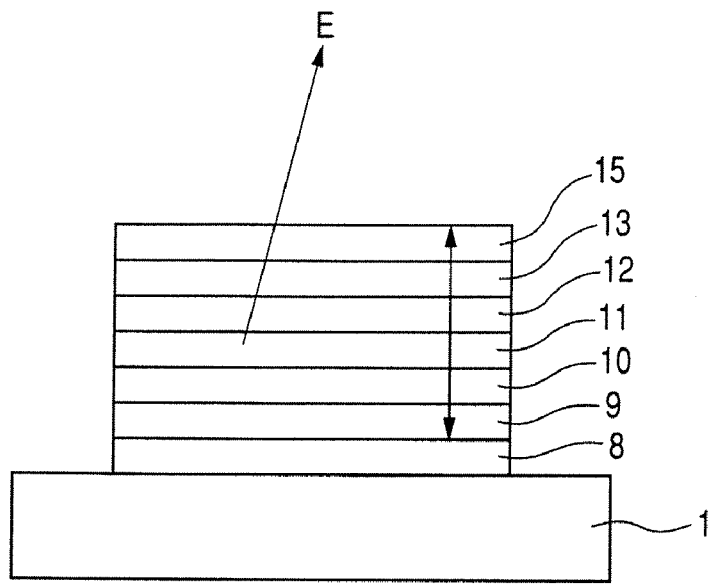
FIG. 11 is a schematic cross-sectional view illustrating an organic light-emitting device having no sealing layer.
Figure 12:
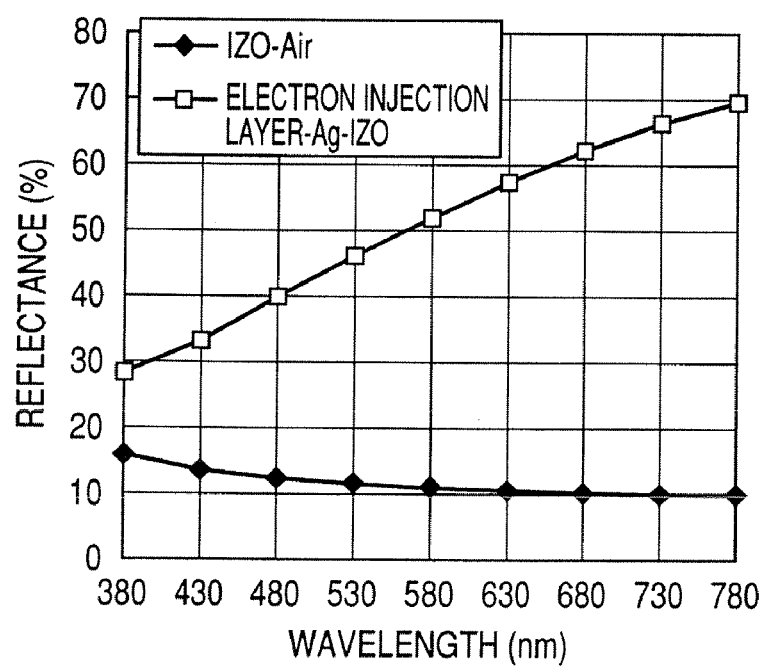
FIG. 12 is a graphical representation illustrating the reflectance of a light extraction side reflection portion of the organic light-emitting device of FIG. 10.

Here, the results of FIG. 2 are compared with the reflectance of the reflection portion on the light extraction side of each of the organic light-emitting devices of FIGS. 10 and 11 illustrated in FIG. 12. As is seen from the comparison, the reflectance at the interface between the first sealing layer 29 and the second sealing layer 30 is sufficiently smaller than the reflectance of the reflection portion on the light extraction side in the conventional organic light-emitting device.

Thus, in the organic light-emitting device according to the present invention, a resonance effect using the reflection at the interface on the light extraction side of the first sealing layer 29 is still present. However, this effect is alleviated in comparison with that of the conventional organic light-emitting device.

Figure 3:
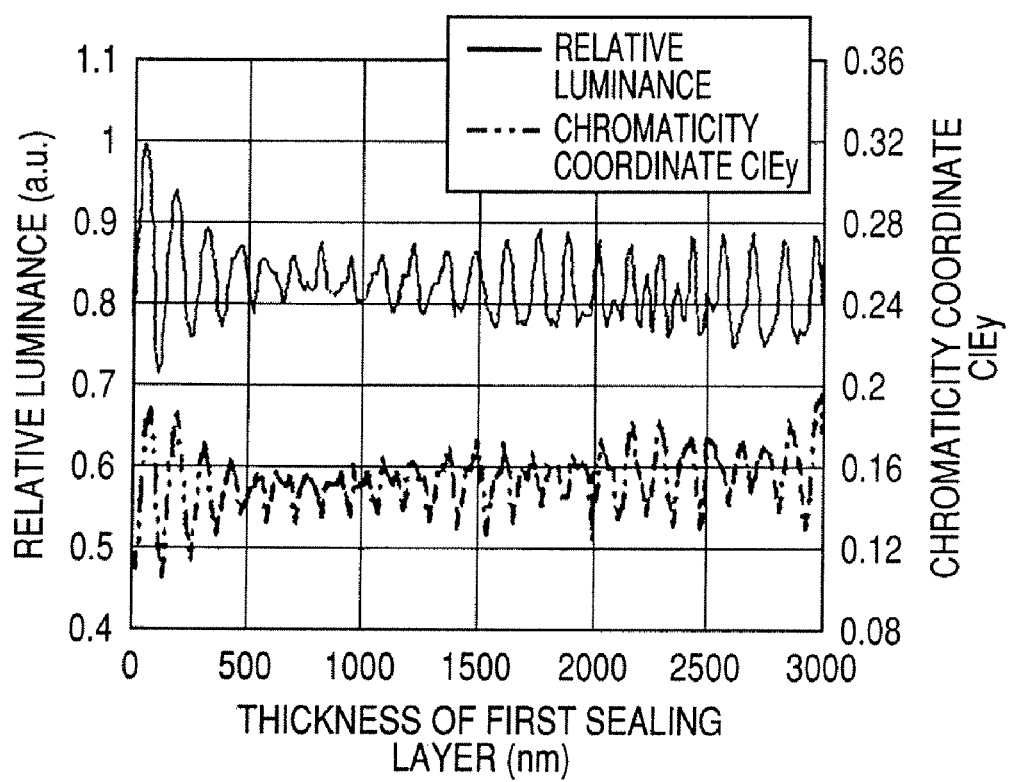
FIG. 3 is a graphical representation illustrating a change in emission characteristics due to the film thickness of the first sealing layer.

Next, the film thickness of the first sealing layer 29 is considered for a case where the refractive index difference at the interface between the first sealing layer 29 and the second sealing layer 30 has a great value. FIG. 3 illustrates the results of investigation on the change in the emission luminance and the chromaticity coordinate CIEy value in a case where the film thickness of the silicon nitride layer as the first sealing layer 29 is changed variously in a blue-light-emitting device having the film thickness values illustrated in Table 6.

TABLE 6

Device film thickness configuration

| Glass substrate | 300,000 nm |
|---|---|
| Resin layer | 100,000 nm |
| Silicon nitride layer | 1,000 nm |
| Silicon oxide layer | 1,000 nm |
| Silicon nitride layer | 10-3,000 nm, 20 nm step |
| Transparent electrode | 60 nm |
| Electron injection layer | 20 nm |
| Electron-transporting layer | 10 nm |
| Emission layer | 20 nm |
| Hole-transporting layer | 15 nm |
| Transparent conductive layer | 10 nm |
| Reflective electrode | 100 nm |
| Substrate | 635,000 nm |

As is seen from FIG. 3, because the resonance effect in the device portion varies depending on the film thickness of the first sealing layer 29, the emission characteristics such as emission luminance and chromaticity varies periodically.

The influence on the emission luminance due to the film thickness of the first sealing layer 29 was investigated and compared for devices that exhibit light emission of red (peak wavelength of 610 nm), green (peak wavelength of 525 nm), and blue (peak wavelength of 450 nm). The results are illustrated in FIG. 4.

Figure 4:
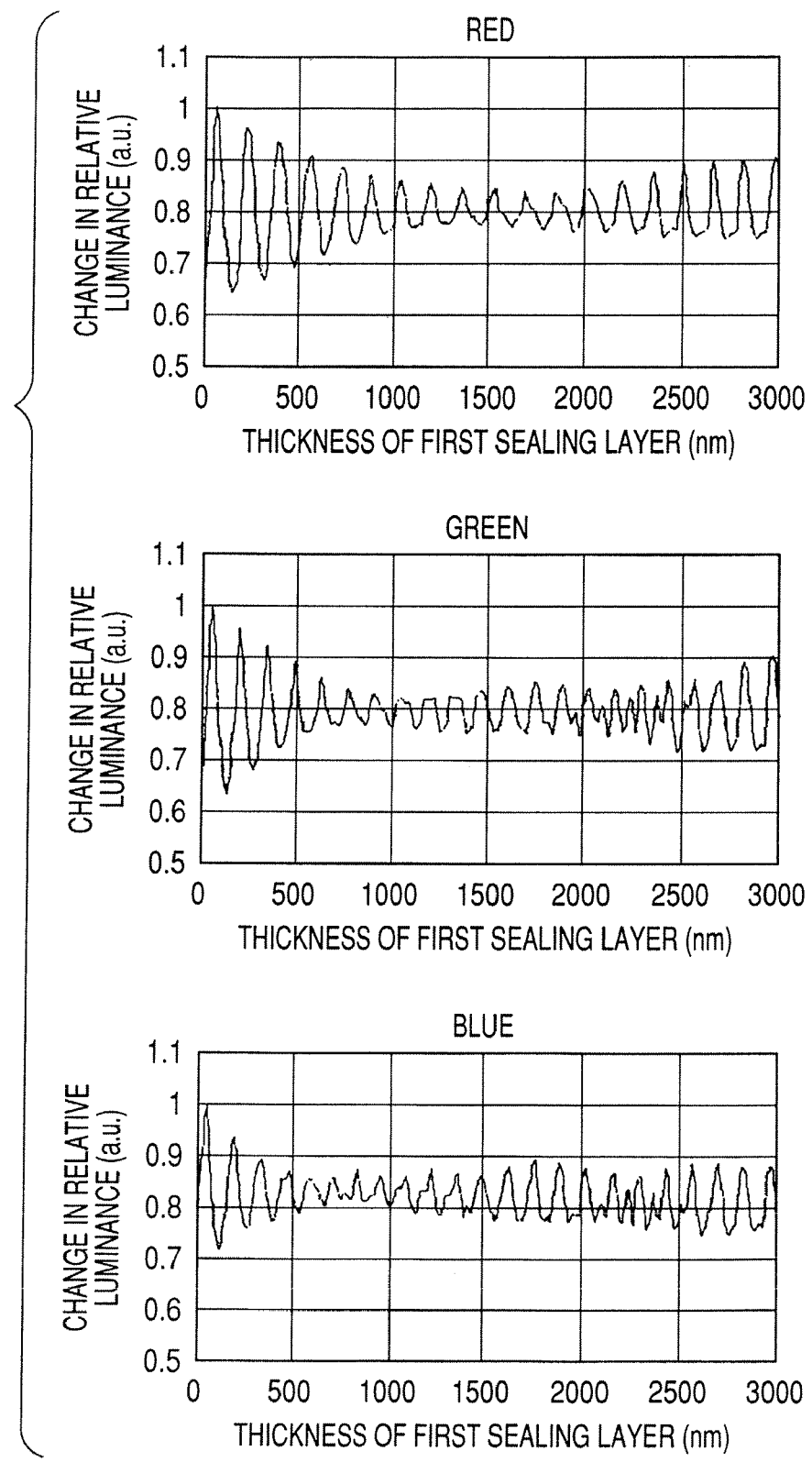
FIG. 4 is a graphical representation illustrating changes in the RGB emission luminance characteristics due to the film thickness of the first sealing layer.

As can be seen from FIG. 4, fluctuation in the emission luminance caused by the film thickness of the first sealing layer 29 varies for each emission color. Further, the change in the emission luminance is particularly remarkable within the range where the first sealing layer 29 is comparatively thin. Therefore, when the film thickness of the first sealing layer 29 is set so as to fall within such a film thickness range, the emission characteristics can be adjusted more effectively, which is suitable. Such a film thickness range of the first sealing layer 29 where the emission characteristics can be adjusted effectively increases with increasing emission wavelength.

Figure 5:
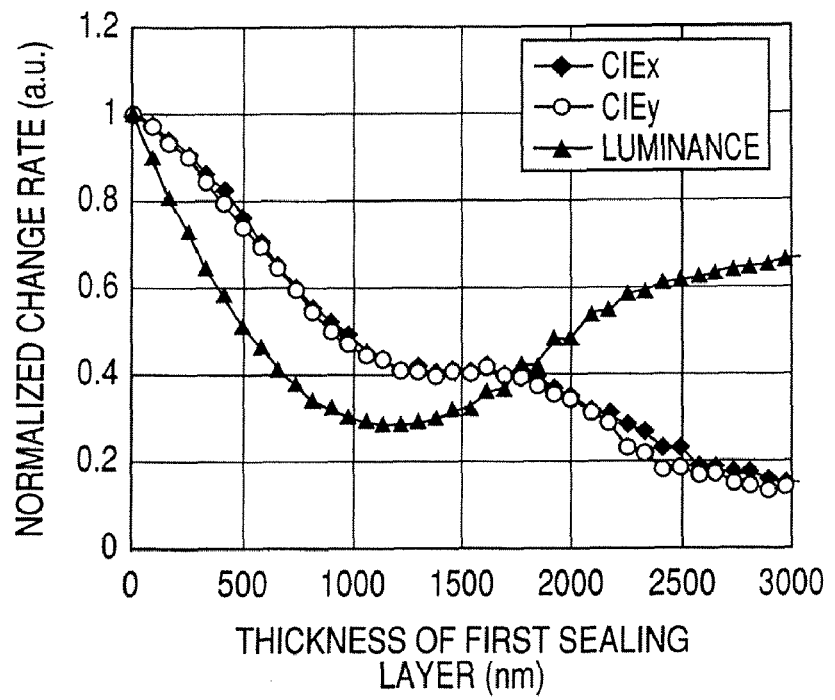
FIG. 5 is a graphical representation illustrating a change rate in emission characteristics caused by the film thickness of the first sealing layer.

Here, the adjustment effect of the emission characteristics achieved by the film thickness of the first sealing layer 29 was investigated for the red device having the longest emission wavelength. FIG. 5 illustrates differentiated and averaged amounts of variation in the emission luminance and the emission chromaticity (CIEx and y values) caused by the film thickness of the first sealing layer 29. The figure illustrates the change rates in the respective emission characteristics caused by the film thickness change of the first sealing layer 29. That is, a greater value of this change rate indicates a higher adjustment effect of the emission characteristics.

As can be seen from FIG. 5, within the range where the film thickness of the first sealing layer 29 is 1,000 nm or less, both the emission luminance and the emission chromaticity have a high change rate. On the other hand, when the film thickness of the first sealing layer 29 is 1,000 nm or more, although the change rate increases again for the emission luminance, the adjustment effect of the emission color is low. Therefore, when the film thickness of the first sealing layer 29 is set to be 1,000 nm or less, the emission characteristics of the emission luminance and the emission chromaticity can be adjusted more effectively, which is desirable.

As described above, in the organic light-emitting device according to the present invention, the reflectance at the interface between the first sealing layer 29 and the second sealing layer 30 is low. Thus, in comparison with the conventional organic light-emitting device, the effect as a microcavity structure for adjusting the emission characteristics is small.

Therefore, in the organic light-emitting device according to the present invention, by focusing attention on the film thickness of the first sealing layer 29, the film thickness thereof was set to fall within the film thickness range where the adjustment effect for the emission characteristics becomes highest. That is, the optical distance between the interface between the reflective electrode 22 and the transparent conductive layer 23 and the interface between the first sealing layer 29 and the second sealing layer 30 was adjusted. By virtue of this, although the effect as a microcavity structure is low, adjustment of the emission characteristics is possible, so that an organic light-emitting device that exhibits desired emission characteristics can be realized.

Further, in a case where the present invention is to be applied to a full color display apparatus in which a plurality of organic light-emitting devices exhibiting light emission of RGB are provided on the same substrate, when the film thickness of the first sealing layer 29 is set to be 1,000 nm or less, the emission characteristics of the red-light-emitting device having the longest emission wavelength can be adjusted on the display apparatus, which is desirable.

Further, when the film thickness of the first sealing layer 29 of display apparatus is set to be 500 nm or less, the emission characteristics can be adjusted also for the blue-light-emitting device having a comparatively short wavelength, which is desirable.

Further, when the film thickness of the first sealing layer 29 of display apparatus is set to be smaller than 50 nm, the highest adjustment effect of the emission characteristics is expected, which is desirable.

Next, the influence on the emission characteristics caused by film thickness fluctuation in the organic light-emitting device according to the present invention is considered. The emission chromaticity change was investigated in a case where the film thicknesses of the organic compound layer and the sealing layer of a blue-light-emitting device constructed with the film thicknesses shown in Table 7 were changed uniformly within the range from −10% to +10%. The results are shown in Table 8.

TABLE 7

Film thickness configuration

| | |
|---|---|
| Glass substrate | 300,000 nm |
| Resin layer | 100,000 nm |
| Silicon nitride layer | 1,000 nm |
| Silicon oxide layer | 1,000 nm |
| Silicon nitride layer | 250 nm |
| Transparent conductive film | 60 nm |
| Electron injection layer | 20 nm |
| Electron-transporting layer | 10 nm |
| Emission layer | 20 nm |
| Hole-transporting layer | 15 nm |
| Transparent conductive layer | 10 nm |
| Reflective electrode | 100 nm |
| Substrate | 635,000 nm |

TABLE 8

Change in emission chromaticity caused by film thickness change

| | −10% | −5% | 0% | +5% | +10% | Change range |
|---|---|---|---|---|---|---|
| CIEx | 0.162 | 0.163 | 0.158 | 0.150 | 0.145 | 0.017 |
| CIEy | 0.160 | 0.132 | 0.112 | 0.126 | 0.149 | 0.047 |

As can be seen from the comparison between Tables 8, 3, and 4, the change in the emission chromaticity caused by a film thickness change in the organic light-emitting device according to the present invention is small in comparison with the case where a similar film thickness change is imparted to an organic light-emitting device or a microcavity type device.

As described above, in the organic light-emitting device according to the present invention, the effect as a microcavity structure is alleviated in comparison with the conventional organic light-emitting device. Thus, the characteristics change associated with film thickness fluctuation can be reduced. Accordingly, the organic light-emitting device according to the present invention does not require a special process, a control system, a step, or the like which has been required in the fabrication of the conventional microcavity type device. Thus, an organic light-emitting device having excellent stability in the emission characteristics can be fabricated in a simple process with a satisfactory throughput.

In this manner, in the organic light-emitting device according to the present invention, even when fluctuation occurs in the film thickness, its influence on the emission characteristics is small and hence an organic light-emitting device exhibiting stable emission characteristics can be realized. Meanwhile, this stabilization of the emission characteristics associated with film thickness fluctuation is attributed to the fact that the organic light-emitting device according to the present invention utilizes a weak resonance effect. The stability in the emission characteristics associated with film thickness fluctuation is connected to the resonance effect in the device. Then, when the resonance effect is weakened, the stability in the emission characteristics is improved. Nevertheless, the adjustment effect of the emission characteristics achieved by the resonance effect becomes small on the other hand.

The magnitude of this resonance effect is determined by the reflectance at the interface between the first sealing layer 29 and the second sealing layer 30. Therefore, in the present invention, by focusing attention on the reflectance at the interface between the sealing layers, the reflectance is set so as to fall within a range which is effective for the adjustment of the emission characteristics. Meanwhile, the reflectance R at the interface between the sealing layers is calculated from the following Equation 2 when the absorption in the individual layers is ignored.

$$R = \frac{(n_1 - n_2)^2}{(n_1 + n_2)^2} \quad \text{(Equation 2)}$$

In the above equation, n1 represents the refractive index of the first sealing layer, and n2 represents the refractive index of the second sealing layer.

As can be seen from Equation 2, the reflectance at the interface is determined by the refractive index of the first sealing layer 29 and the refractive index of the second sealing layer 30. From Table 5, when silicon nitride is selected for the first sealing layer 29 and silicon oxide is selected for the second sealing layer 30, a refractive index difference of approximately 0.4 to 0.5 depending on the wavelength is obtained in the interface. The reflectance at this interface is approximately 1.5 to 2% (FIG. 2).

Figure 6:
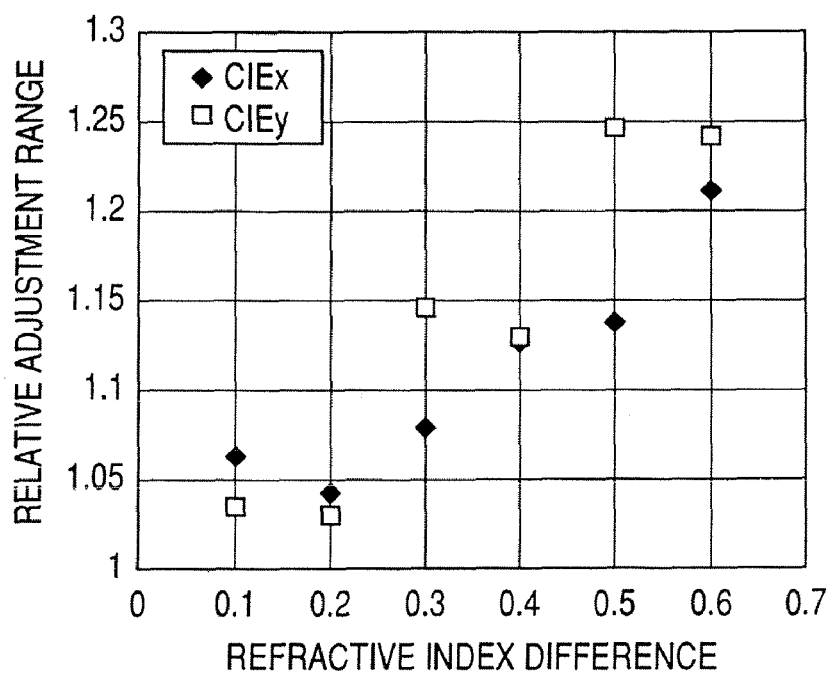
FIG. 6 is a graphical representation illustrating the relation between the refractive index difference in an interface and the adjustment range of CIE chromaticity.

Here, the influence of the refractive index difference at the interface on the adjustment effect of the emission characteristics was investigated. In a device having the film thickness configuration of Table 9, a case where the interface between the first sealing layer 29 (silicon nitride layer) and the second sealing layer 30 (virtual material layer) has a refractive index difference of 0 to 0.6 was assumed. Then, for each refractive index difference value, fluctuation within the range shown in Table 9 was generated in the hole-transporting layer 24 and the electron injection layer 27, so that the change in the emission characteristics was estimated using a calculation software. For the emission characteristics, by focusing attention on the CIE chromaticity coordinate, investigation was carried out for the range of CIE chromaticity coordinate where adjustment can be achieved by film thickness fluctuation. The results are illustrated in FIG. 6. FIG. 6 illustrates a relative change in the adjustment range of CIEx and y values in a case where the chromaticity coordinate adjustment range when the refractive index difference at the interface between the first sealing layer 29 and the second sealing layer 30 is 0 is defined as 1. That is, a wider relative adjustment range indicates higher degree of freedom in the chromaticity adjustment using reflection at the interface between the sealing layers.

TABLE 9

| Film thickness configuration | |
| --- | --- |
| Glass substrate | 300,000 nm |
| Resin layer | 100,000 nm |
| Silicon nitride layer | 1,000 nm |
| Virtual material layer | 1,000 nm |
| Silicon nitride layer | 250 nm |
| Transparent conductive film | 60 nm |
| Electron injection layer | 10-100 nm, 5 nm step |
| Electron-transporting layer | 10 nm |
| Emission layer | 20 nm |
| Hole-transporting layer | 10-70 nm, 5 nm step |
| Transparent conductive layer | 10 nm |
| Reflective electrode | 100 nm |
| Substrate | 635,000 nm |

Figure 7:
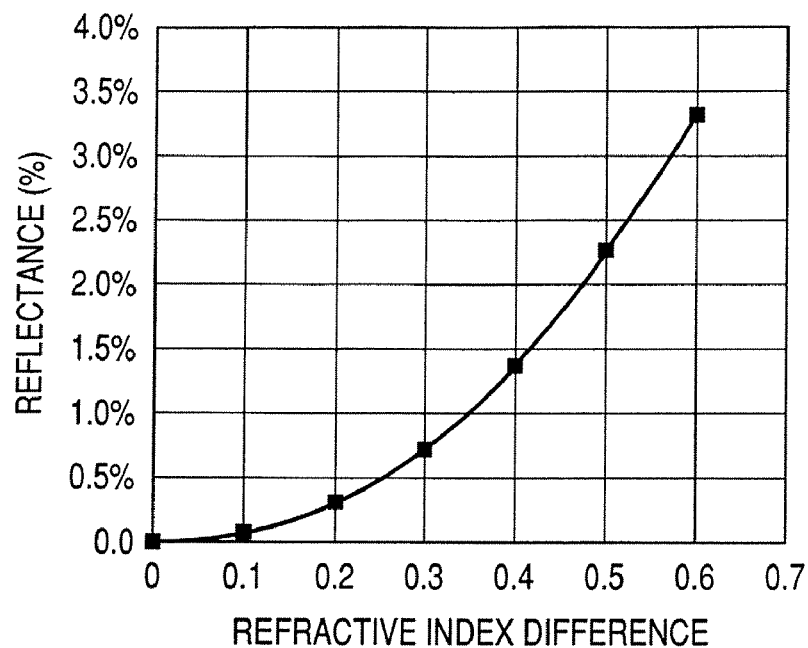
FIG. 7 is a graphical representation illustrating the relation between the refractive index difference and the interface reflectance.

As can be seen from FIG. 6, within the range where the refractive index difference at the interface between the first sealing layer 29 and the second sealing layer 30 becomes 0.3 or greater, the adjustment range of the CIE chromaticity coordinate becomes wider. FIG. 7 shows the relation between the refractive index difference and the interface reflectance at the interface between the first sealing layer 29 and the second sealing layer 30. When the refractive index difference in the interface is 0.3, the reflectance thereof is approximately 0.8%. Thus, when the materials for the first sealing layer 29 and the second sealing layer 30 are selected such that the interface reflectance becomes 0.8% or more, high degree of freedom is obtained in the emission characteristics adjustment, which is desirable.

In order that the reflectance at the interface between the first sealing layer 29 and the second sealing layer 30 is 0.8% or more, the respective sealing layer materials are preferably selected such that the refractive index difference at the interface between the first sealing layer 29 and the second sealing layer 30 becomes 0.3 or more. In particular, when silicon nitride is selected as the first sealing layer 29 and silicon oxide is selected as the second sealing layer 30, the refractive index difference at the interface between the sealing layers becomes 0.4 to 0.5, which is desirable.

Further, the material of the second sealing layer 30 is not limited to particular one as long as the material has a smaller refractive index than the first sealing layer 29 and the difference is 0.3 or more. When the first sealing layer 29 has a sufficiently high blocking effect against moisture and oxygen, for the second sealing layer 30, various materials can be selected, regardless of the blocking effect against moisture and oxygen. Thus, in addition to the use of inorganic materials such as silicon oxide described in this embodiment, an organic material such as a resin may be used.

Further, it is desirable that the film thickness of the second sealing layer 30 is 1,500 nm or more. Thereby, even when a foreign substance of a size of, for example, about 1,000 nm is present during the sealing layer formation, the foreign substance can be taken into and sealed within the second sealing layer 30. At that time, when the material used for the second sealing layer 30 has a low optical absorption in the visible wavelength range, absorption loss of the emission light caused by the sealing layer can be reduced so that the utilization efficiency for the emission light can be improved, which is desirable.

Meanwhile, the refractive index of the sealing layer is considered below. A general tendency is observed that materials having a high blocking effect against moisture and oxygen have a comparatively high refractive index, and that when their blocking effect falls, their refractive index also reduces. Thus, in the organic light-emitting device according to the present invention, in some cases, such a combination is used that the material of the first sealing layer 29 has a high refractive index and a high blocking effect against moisture and oxygen and the material of the second sealing layer 30 has a low refractive index and a comparatively low blocking effect against moisture and oxygen. Further, in some cases, for the purpose of emission characteristics adjustment, the first sealing layer 29 has a film thickness of 1,000 nm or less which is comparatively thin as a sealing layer, so that the first sealing layer 29 may have an insufficient blocking effect against moisture and oxygen.

Therefore, it is preferable that the material and film thickness of the third sealing layer 31 be selected from the viewpoint of the blocking effect against moisture and oxygen. A moisture-proof inorganic material such as silicon nitride can be desirably selected for the third sealing layer 31. At that time, at the interface between the second sealing layer 30 and the third sealing layer 31, a refractive index difference is generated similarly to that at the interface between the first sealing layer 29 and the second sealing layer 30 so that a reflective surface is formed. The light reflected at the interface between the second sealing layer 30 and the third sealing layer 31 also has a relation with the resonance effect, so that an adverse influence may be exerted on the emission characteristics such as the luminance and the chromaticity, and hence more complicated adjustment for the emission characteristics becomes necessary.

At that time, when the film thickness of the second sealing layer 30 is set to be 1,500 nm or more, preferably 2,000 nm or more, the light reflected at the interface between the second sealing layer 30 and the third sealing layer 31 does not affect the resonance effect caused by the light reflected at the interface between the first sealing layer 29 and the second sealing layer 30. Thus, satisfactory emission characteristics can be obtained easily, which is desirable.

Further, when the interface between the second sealing layer 30 and the third sealing layer 31 has a fine unevenness, the light reflected at the interface is scattered. Therefore, there can be obtained an effect similar to that of the case where the film thickness of the second sealing layer 30 is increased.

The sealing layers 29, 30, and 31 may be formed by an arbitrary method such as sputtering, CVD, and evaporation. Further, when the layers are to be formed using a resin material, the material may be dissolved in an appropriate solvent and then applied by a known coating method. At that time, the first sealing layer 29 is bonded to the transparent electrode 28 without a gap. This prevents moisture or oxygen from entering into the organic compound layer through a gap between the first sealing layer 29 and the transparent electrode 28, so that a highly reliable organic light-emitting device can be realized.

The material used for the resin layer 32 is not limited to particular one. For example, a transparent acrylic or epoxy resin may be used. The resin layer 32 is provided in a state of being filled between the sealing layer 31 and the glass substrates 33 without a gap.

The glass substrate 33 is not limited to particular one. Materials therefor include a substrate made of an inorganic material such as glass, a plastic substrate, and a film-shaped substrate that can be flexibly curved.

Further, in place of the use of the glass substrate, an optical member such as a circularly polarizing plate or a color filter may be bonded directly to the resin layer. When the glass substrate is omitted, further thickness reduction of the organic light-emitting device can be achieved.

EXAMPLES

Typical production procedures for the organic light-emitting device according to the present invention are described below. However, the present invention is not limited to these examples.

Example 1

The organic light-emitting device having the structure illustrated in FIG. 1 was produced by the method described below. On a glass substrate 21, silver alloy (AgCuNd) having a film thickness of approximately 100 nm serving as the reflective electrode 22 and IZO having a film thickness of 10 nm serving as the transparent conductive layer 23 were formed by sputtering. This substrate was ultrasonically cleaned with isopropyl alcohol (IPA), washed with boiled water, and then dried. Further, after being cleaned with UV/ozone, organic compound layers were formed by a vacuum evaporation method.

First, as the hole-transporting layer 24, a film of Compound (I) represented by the following structure formula was formed in a thickness of 10 nm. At that time, the degree of vacuum was $1 \times 10^{-4}$ Pa, while the evaporation rate was 0.2 nm/sec.

Compound (I)

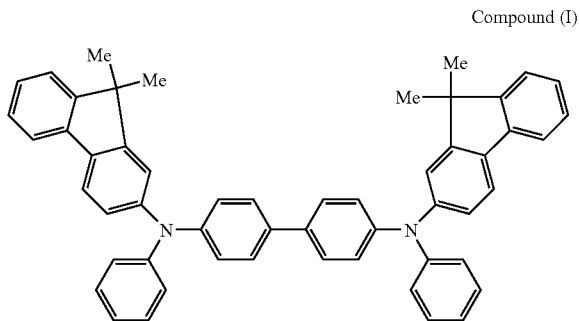

Then, as the emission layer 25 that emits blue light, a film was formed in a thickness of 20 nm by coevaporation of Compound (II) shown below as a host and Compound (III) as a light-emitting dopant (weight ratio of 80:20). At that time, the degree of vacuum was $1 \times 10^{-4}$ Pa, while the film formation rate was 0.2 nm/sec.

Compound (II)

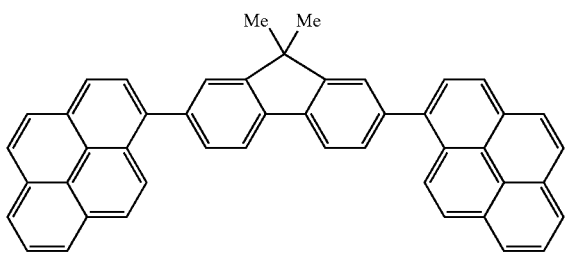

Compound (III)

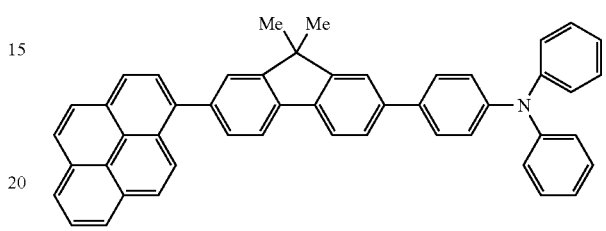

Further, as the electron-transporting layer 26, a film of bathophenathroline (Bphen) was formed in a thickness of 10 nm by an evaporation method. At this time, the layer is formed at a degree of vacuum of $1.0 \times 10^{-4}$ Pa and a film formation rate of 0.2 nm/sec.

Next, as a common electron injection layer 27, a film was formed in a thickness of 25 nm by coevaporation of Bphen and $Cs_2CO_3$ (weight ratio of 90:10). At this time, the layer is formed at a degree of vacuum of $3 \times 10^{-4}$ Pa and a deposition rate of 0.2 nm/sec.

Then, the substrate having the films up to and including the electron injection layer 27 formed thereon was moved in a vacuum state into a sputtering chamber. Then, on the electron injection layer 27, a film of IZO was formed in a thickness of 50 nm as the transparent electrode 28.

After that, the substrate was moved in a vacuum state into another sputtering apparatus. Then, on the transparent electrode 28, film formation was carried out using silicon nitride in a film thickness of 20 nm as the first sealing layer 29 and using silicon oxide in a film thickness of 1,000 nm as the second sealing layer 30. Further, film formation was carried out using silicon nitride in a film thickness of 1,000 nm as the third sealing layer 31.

The refractive index differences at the interface between the first sealing layer 29 and the second sealing layer 30 obtained for various wavelengths at this time are shown in Table 10.

TABLE 10

| | Refractive index differences at interface between first sealing layer and second sealing layer | | | | | | | |
|---|---|---|---|---|---|---|---|---|
| Wavelength | 350 nm | 400 nm | 450 nm | 500 nm | 550 nm | 600 nm | 650 nm | 700 nm |
| Refractive index difference | 0.50 | 0.47 | 0.45 | 0.43 | 0.42 | 0.42 | 0.41 | 0.41 |

Then, on the third sealing layer 31, an acrylic resin was provided as the resin layer 32. After that, the glass substrate 33 was bonded thereon, whereby an organic light-emitting device was obtained.

The emission characteristics of the thus obtained organic light-emitting device are shown in Table 11.

TABLE 11

Emission characteristics summary

| | CIEx | CIEy | Emission efficiency (cd/A) |
|---|---|---|---|
| Example 1 | 0.152 | 0.106 | 2.78 |
| Example 2 | 0.154 | 0.135 | 2.79 |
| Comparative Example 1 | 0.152 | 0.164 | 3.01 |
| Comparative Example 2 | 0.153 | 0.142 | 2.92 |

Table 12 shows the range of emission chromaticity change in a case where the film thicknesses of the organic compound layer and the sealing layer constituting the organic light-emitting device were changed uniformly within the range from −10% to +10%.

TABLE 12

Emission chromaticity change range at the time of film thickness fluctuation

| | Change range | |
|---|---|---|
| | CIEx | CIEy |
| Example 1 | 0.008 | 0.026 |
| Example 2 | 0.002 | 0.015 |
| Comparative Example 1 | 0.005 | 0.020 |
| Comparative Example 2 | 0.003 | 0.006 |

Further, Table 14 shows the adjustment ranges of the emission chromaticity in a case where the thicknesses of the hole-transporting layer and the electron injection layer of the organic light-emitting device were changed within the ranges shown in Table 13.

TABLE 13

Film thickness adjustment range

| Hole-transporting layer | 10-70 nm, 5 nm step |
|---|---|
| Electron injection layer | 10-100 nm, 5 nm step |

TABLE 14

CIE chromaticity coordinate adjustment range

| | Adjustment range | |
|---|---|---|
| | CIEx | CIEy |
| Example 1 | 0.131 | 0.367 |
| Example 2 | 0.087 | 0.289 |
| Comparative Example 1 | 0.101 | 0.299 |
| Comparative Example 2 | 0.098 | 0.313 |

As can be seen from Table 11, the organic light-emitting device exhibited satisfactory emission efficiency and emission chromaticity. In particular, the CIEy value of the emission chromaticity was approximately 0.1 and hence satisfactory emission color of deep blue was obtained.

Example 2

In the present example, an organic light-emitting device was produced by following the same procedure as in Example 1 with the exception that the film thickness of the first sealing layer was 1,000 nm.

As shown in Table 12, according to this organic light-emitting device, an organic light-emitting device that has stable emission characteristics and exhibits excellent light emission even when a film thickness fluctuation occurs can be produced in a simple process with a satisfactory throughput.

Comparative Example 1

In this comparative example, an organic light-emitting device was produced by following the same procedure as in Example 1 with the exception that the film thickness of the first sealing layer was 1,500 nm. The emission color of the organic light-emitting device of this comparative example was approximately 0.16 in terms of the chromaticity coordinate CIEy value. Thus, light emission of deep blue achieved by the devices of Examples 1 and 2 was not obtained.

Comparative Example 2

In this comparative example, an organic light-emitting device was produced by following the same procedure as in Example 1 with the exception that silicon oxynitride was used for the second sealing layer in place of the silicon oxide used in Example 1.

The refractive index differences at the interface between the first sealing layer and the second sealing layer obtained at this time are shown in Table 15

TABLE 15

Refractive index difference in interface between first sealing layer and second sealing layer

| | 350 nm | 400 nm | 450 nm | 500 nm | 550 nm | 600 nm | 650 nm | 700 nm |
|---|---|---|---|---|---|---|---|---|
| Refractive index difference | 0.13 | 0.11 | 0.09 | 0.07 | 0.06 | 0.05 | 0.04 | 0.04 |

The organic light-emitting device of this comparative example had a narrower adjustment range for the emission chromaticity than the organic light-emitting device described in Example 1. In order to attain more effective emission characteristics adjustment, a refractive index difference of 0.3 or more is necessary to be provided at the interface between the first sealing layer and the second sealing layer.

Example 3

Figure 8:
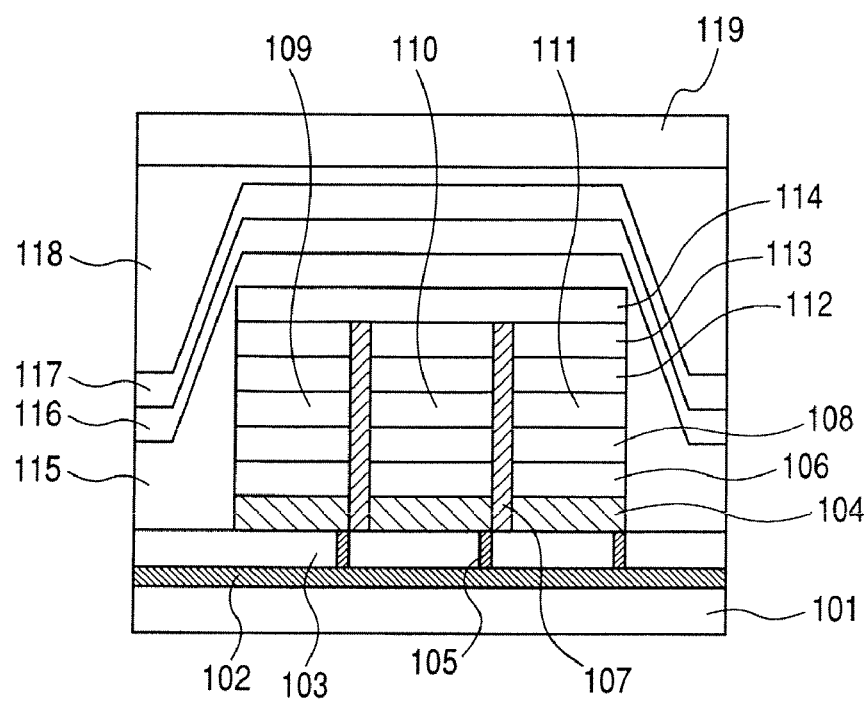
FIG. 8 is a schematic cross-sectional view illustrating an embodiment of a display apparatus according to the present invention.
Figure 9:
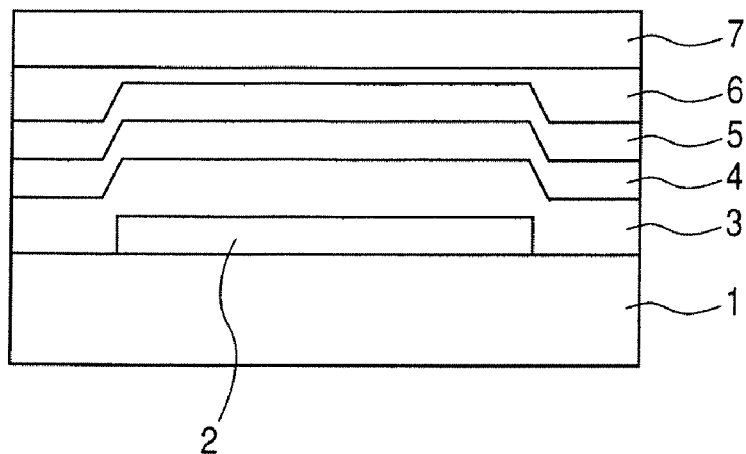
FIG. 9 is a schematic cross-sectional view illustrating the display apparatus described in Japanese Patent Application Laid-Open No. 2001-357973.

A display apparatus of three colors of RGB having the structure shown in FIG. 8 was produced by the method described below.

On a glass substrate 101 serving as a support member, a TFT drive circuit 102 including a low temperature polysilicon was formed, and a planarizing film 103 of an acrylic resin was formed thereon, whereby a substrate was obtained. Then, on the substrate, a film of a silver alloy (AgCuNd) as a reflective metal 104 was formed in a thickness of approximately 100 nm by a sputtering method and patterned. The reflective metal 104 was electrically connected to the TFT drive circuit 102 through contact holes 105. After that, a film of IZO as a transparent conductive layer 106 was formed in a thickness of 10 nm by a sputtering method and patterned. Further, a device separation film 107 was formed using an acrylic resin. This substrate was ultrasonically cleaned with isopropyl alcohol (IPA), washed with boiled water, and then dried. Further, after being cleaned with UV/ozone, organic compound layers were formed by a vacuum evaporation method.

First, as the hole-transporting layer 108 which is common to all the devices, a film of Compound (I) represented by the structure formula mentioned above was formed in a thickness of 10 nm for all the devices (pixels). At that time, the degree of vacuum was $1\times10^{-4}$ Pa, while the evaporation rate was 0.2 nm/sec.

Next, as the emission layers, film formation was carried out using shadow masks for the respective emission layers of RGB. As the red-light-emission layer, an emission layer 109 having a film thickness of 80 nm was formed by coevaporation of Alq3 as a host and a light-emitting compound DCM (4-(dicyanomethylene)-2-methyl-6(p-dimethylaminostyryl)-4H-pyran)(at a weight ratio of 99:1). As the green-light-emission layer, an emission layer 110 having a film thickness of 60 nm was formed by coevaporation of Alq3 as a host and a light-emitting compound coumarin 6 (at a weight ratio of 99:1). As the blue-light-emission layer, an emission layer 111 having a film thickness of 20 nm was formed by coevaporation of Compound (II) as a host and Compound (III) represented by the above mentioned structural formulae (at a weight ratio of 80:20). At that time, the degree of vacuum was $1\times10^{-4}$ Pa, while the film formation rate was 0.2 nm/sec.

Further, as the common electron-transporting layer 112, a film of bathophenathroline (Bphen) was formed in a thickness of 10 nm by a vacuum evaporation method. At this time, the layer is formed at a degree of vacuum of $1.0\times10^{-4}$ Pa and a film formation rate of 0.2 nm/sec.

Next, as the common electron injection layer 113, a film was formed in a thickness of 25 nm by coevaporation of Bphen and $Cs_2CO_3$ (weight ratio of 90:10). At this time, the layer is formed at a degree of vacuum of $3\times10^{-4}$ Pa and a deposition rate of 0.2 nm/sec.

Then, the substrate having the films up to and including the electron injection layer 113 formed thereon was moved in a vacuum state into a sputtering chamber. Then, on the electron injection layer 113, a film of IZO was formed in a thickness of 50 nm as the transparent electrode 114.

After that, the substrate was moved in a vacuum state into another sputtering apparatus. Then, on the transparent electrode 114, film formation was carried out using silicon nitride in a film thickness of 20 nm as the first sealing layer 115 and using silicon oxide in a film thickness of 1,000 nm as the second sealing layer 116. Further, film formation was carried out using silicon nitride in a film thickness of 1,000 nm as the third sealing layer 117.

Then, on the third sealing layer 117, an acrylic resin was provided as the resin layer 118. After that, the glass substrate 119 was bonded thereon, whereby the display apparatus was obtained.

The emission characteristics of the thus obtained display apparatus are shown in Table 16. In Table 16, in addition to the emission chromaticity and the emission efficiency of each of RGB colors, the NTSC ratio of the color reproduction range of the display apparatus and the power consumption at the time when a white color with chromaticity coordinates of (0.32, 0.33) is displayed at a luminance of 250 cd/m$^2$.

TABLE 16

| | | Emission characteristics of display apparatus | | | | |
|---|---|---|---|---|---|---|
| | | Red | Green | Blue | Color reproduction range | Power consumption |
| Ex. 3 | CIE chromaticity coordinates | (0.652, 0.347) | (0.279, 0.654) | (0.152, 0.106) | 77% | 397 mW |

TABLE 16-continued

| | | Emission characteristics of display apparatus | | | | |
|---|---|---|---|---|---|---|
| | | Red | Green | Blue | Color reproduction range | Power consumption |
| | Emission efficiency (cd/A) | 13.3 | 20.9 | 2.78 | | |
| Comp. Ex. 3 | CIE chromaticity coordinate | (0.651, 0.384) | (0.294, 0.632) | (0.152, 0.164) | 64% | 512 mW |
| | Emission efficiency (cd/A) | 16.7 | 16.0 | 3.01 | | |

As described above, the present display apparatus exhibited satisfactory emission characteristics with a color reproduction range of 77% and a power consumption of 397 mW.

Comparative Example 3

In this comparative example, a display apparatus was produced by following the same procedure as in Example 3 with the exception that the film thickness of the first sealing layer was 1,500 nm. The emission characteristics of the display apparatus of this comparative example are shown in Table 16. As can be seen from Table 16, the color reproduction range of the display apparatus of this comparative example was narrower than that of the display apparatus of Example 3. Further, the power consumption increased by approximately 28% in comparison with the display apparatus of Example 3.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-046690, filed Feb. 27, 2007, which is hereby incorporated by reference in its entirety.

What is claimed is:
1. A display apparatus comprising:
   a substrate;
   a plurality of organic light-emitting devices including an organic red-light-emitting device, an organic green-light-emitting device, and an organic blue-light-emitting device, and each organic light-emitting device comprising a first electrode, an organic compound layer, and a second electrode as a light extraction side electrode;
   a first sealing layer arranged on the light extraction side of the second electrodes; and
   a second sealing layer arranged in contact with the light extraction side of the first sealing layer,
   wherein an optical distance between a first reflective surface located on the substrate side relative to the organic compound layers and a second reflective surface located on the sealing layer side relative to the organic compound layers is adjusted so as to form a resonance portion of a resonator structure that causes resonance of light emitted from the organic compound layers,
   wherein the second reflective surface is an interface between the first sealing layer and the second sealing layer,
   wherein the first sealing layer is disposed continuously extending over the organic red-light-emitting device, the organic green-light-emitting device, and the organic blue-light-emitting device in a thickness of 1,000 nm or less, and wherein the second sealing layer is disposed continuously extending over the organic red-light-emitting device, the organic green-light-emitting device, and the organic blue-light-emitting device in a thickness of 1,500 nm or more.

2. The display apparatus according to claim 1, wherein the second electrode consists of an oxide transparent conductive film.

3. The display apparatus according to claim 1, wherein the first sealing layer and the second sealing layer have a difference in refractive index of 0.3 or more.

4. The display apparatus according to claim 1, wherein the first sealing layer comprises silicon nitride, and the second sealing layer comprises silicon oxynitride.

5. The display apparatus according to claim 1, further comprising a third sealing layer arranged in contact with a light extraction side surface of the second sealing layer.

6. The display apparatus according to claim 5, wherein the third sealing layer comprises silicon nitride.

7. The display apparatus according to claim 1, wherein the second sealing layer has a thickness of 2,000 nm or more.

8. The display apparatus according to claim 1, wherein the second sealing layer comprises a resin.

* * * * *